(12) United States Patent
Park (10) Patent No.: US 7,531,857 B2
(45) Date of Patent: May 12, 2009

(54) IMAGE SENSOR WITH BURIED BARRIER LAYER HAVING DIFFERENT THICKNESS ACCORDING TO WAVELENGTH OF LIGHT AND METHOD OF FORMING THE SAME

(75) Inventor: Young-Hoon Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 226 days.

(21) Appl. No.: 11/335,405

(22) Filed: Jan. 19, 2006

(65) Prior Publication Data
US 2006/0163618 A1 Jul. 27, 2006

(30) Foreign Application Priority Data
Jan. 24, 2005 (KR) .................. 10-2005-0006371

(51) Int. Cl.
*H01L 31/062* (2006.01)
*H01L 31/113* (2006.01)
(52) U.S. Cl. .................. 257/291; 257/292; 257/294
(58) Field of Classification Search .......... 257/233, 257/234, 291, 292, 294, 440, E27.13, E27.131, 257/E27.133
See application file for complete search history.

(56) References Cited

U.S. PATENT DOCUMENTS

| 6,756,616 B2 | 6/2004 | Rhodes | 257/291 |
| 2004/0080638 A1 | 4/2004 | Lee | 348/272 |

FOREIGN PATENT DOCUMENTS

| JP | 2004-146764 | 5/2004 |
| KR | 10-0390823 | 6/2003 |
| KR | 10-2004-0036087 | 4/2004 |

*Primary Examiner*—Thien F Tran
(74) *Attorney, Agent, or Firm*—Mills & Onello LLP (57) ABSTRACT

There is provided an image sensor and a method of forming the same in order to prevent cross talk and to improve sensitivity. The image sensor includes a plurality of pixels for embodying colors having different wavelengths, and each of pixels includes a photoelectric conversion unit and a buried barrier layer having different thicknesses according to the wavelengths. The method of forming the image sensor includes: forming an epitaxial layer of a first type on a semiconductor substrate of a first type; and forming a buried barrier layer in the first type of epitaxial layer. The buried barrier layer is formed to have different thickness according to the wavelength.

11 Claims, 8 Drawing Sheets

IMAGE SENSOR WITH BURIED BARRIER LAYER HAVING DIFFERENT THICKNESS ACCORDING TO WAVELENGTH OF LIGHT AND METHOD OF FORMING THE SAME

BACKGROUND OF THE INVENTION

1. Related Application

This application relies for priority on Korean application number 2005-06371, filed on Jan. 24, 2005, in the Korean Intellectual Property Office, the entire contents of which are incorporated herein by reference.

2. Field of the Invention

The present invention relates to an image sensor and a method of forming the same and more particularly, to an image sensor including a buried barrier layer having a different thickness according to a wavelength of light and a method of forming the same.

3. Description of the Related Art

Image sensors convert optical images to electric signals. Image sensors are typically classified as complementary Metal-Oxide-Silicon (CMOS) image sensors or charge-coupled device (CCD) image sensors. The CCD image sensor has superior photo sensitivity and noise characteristics compared to the CMOS image sensor. However, it is difficult and complicated to highly integrate the CCD image sensor, and the CCD image sensor consumes a large amount electric power compared to the CMOS image senor. On the contrary, the CMOS image sensor is manufactured by a simpler manufacturing process compared to the CCD image sensor and the CMOS image sensor is suitable to be highly integrated. Also, the CMOS image sensor consumes less electric power than the CCD image sensor.

According to dramatic development of semiconductor manufacturing technology, a CMOS image sensor manufacturing technology has also rapidly developed, and characteristics of the CMOS image sensor have improved.

Conventionally, a pixel of the CMOS image sensor includes a plurality of photodiodes for receiving light and CMOS elements for controlling image signals inputted from the photodiodes. The photodiode generates an electron-hole pair according to wavelength and intensity of red, green, or blue light incident through color filters, and outputs signals varied according to a quantity of the generated electrons. That is, the CMOS image sensor detects images based on a variation of the signal outputted from the photodiodes.

The photodiode includes two impurity implantation regions doped with different impurities. Theses impurity implantation regions of the photodiode are formed to have identical range of projection (Rp). A penetration depth of light is varied according to the wavelength of the light. That is, higher wavelength of the light is penetrated deeper than shorter wavelength. However, an absorption coefficient in a silicon layer decreases in reverse proportion to the wavelength of the light. Since a red light has a longer wavelength than green light and blue light, the absorption coefficient of the red light is lower than the green and the blue light. Accordingly, the image sensor may have difficulty detecting the red signal and have unevenness of color detection ratio. The penetration depths of the green light and the blue light are limited within a photodiode region. Therefore, the photodiodes output stable image signals of the green and the blue light. However, since the wavelength of the red light is longer and the penetration depth of the red light is deeper, the red light may penetrate deeper than the photodiode region. Accordingly, if an electron-hole pair is generated outside of the photodiode region, the generated electron causes cross-talk since the generated electron moves to a photodiode region of a neighboring pixel.

SUMMARY OF THE INVENTION

Accordingly, the present invention is directed to an image sensor including a buried barrier layer having different thicknesses according to a wavelength of light and a method of forming the same that substantially obviates one or more problems due to limitations and disadvantages of the related art.

It is a feature of the present invention to provide a CMOS image sensor preventing cross-talk of red light and a method of manufacturing the same.

It is another feature of the present invention to provide a CMOS image sensor having high sensitivity and a method of manufacturing the same.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In an aspect of the present invention, there is provided a CMOS image sensor including a plurality of pixels associated with colors of different wavelengths, wherein each of the pixels has: a photoelectric conversion unit; and a buried barrier layer arranged below the photoelectric conversion unit, wherein a thickness of the buried barrier layer is different according to the different wavelengths.

The photoelectric conversion unit may include: a first impurity implantation region of a first type; and a second impurity implantation region of a second type arranged under the first impurity implantation region, wherein the buried barrier layer is doped with impurities of the first type.

The buried barrier layer may be separated from the second impurity implantation region.

A thickness of the buried barrier layer may be thinner as the wavelength is longer.

In another aspect of the present invention, there is provided a CMOS image sensor having a first pixel associated with a red color, a second pixel associated with a green color and a third pixel associated with a blue color, wherein each of pixels includes: a semiconductor substrate of a first type; an epitaxial layer of a first type on the semiconductor substrate; a photoelectric conversion unit arranged on the epitaxial layer; and a first buried barrier layer below the photoelectric conversion unit in the epitaxial layer, wherein the second pixel and the third pixel further include a second buried barrier layer on the first buried barrier layer.

The photoelectric conversion unit may include a first impurity implantation region of a first type and a second impurity implantation region of a second type under the first impurity implantation region, wherein the first buried barrier layer and the second buried barrier layer are doped with impurities of the first type.

A concentration of impurity doped on the first buried barrier layer may be identical to a concentration of an impurity doped on the second buried barrier layer, and is higher than a concentration of impurity doped on the epitaxial layer. Also, the second buried barrier layer is separated from the second impurity implantation region.

The third pixel further may include a third buried barrier layer formed on the second buried barrier layer, wherein the third buried barrier layer is doped with impurity having a concentration and a type the same as those of an impurity doped on the first buried barrier layer.

The third buried barrier layer may be separated from the second impurity implantation region.

Each of the pixels of the CMOS image sensor may further include: an isolation layer arranged on the epitaxial layer for isolating each of pixels; an interlayer insulation layer covering the epitaxial layer and the isolation layer; a planarization layer on the interlayer insulation layer; a color filter arranged on the planarization layer associated with each of colors corresponding to each of the pixels; and a micro lens on the color filter.

According to another aspect, the invention is directed to a method of manufacturing a CMOS image sensor having pixels associated with colors of different wavelengths. According to the method, an epitaxial layer of a first type is formed on a semiconductor substrate of the first type. A first buried barrier layer is formed in the epitaxial layer of the first type. A photoelectric conversion unit is formed on the buried barrier layer. Herein, the thickness of the buried barrier layer is different according to the different wavelengths.

In one embodiment, the buried barrier layer is formed by doping a first type impurity to have a higher concentration than the epitaxial layer.

The forming of the photoelectric conversion may comprise: forming a second impurity implantation region of a second type at an upper part of the epitaxial layer; and forming a first impurity implantation region of a first type on the second type of the second impurity implantation region. The second impurity implantation region is formed to be separated from the buried barrier layer.

In one embodiment, the buried barrier layer is formed to have a thinner thickness as the wavelength is longer.

According to another aspect, the invention is directed to a method of manufacturing a CMOS image sensor having a first pixel associated with a red color, a second pixel associated with a green color and a third pixel associated with a blue color, the method including: forming an epitaxial layer of a first type on a semiconductor substrate of the first type; forming a first buried barrier layer in the epitaxial layer of the first type by performing an ion implantation process; forming an isolation layer for isolating the pixels; forming a first mask covering the epitaxial layer of the first pixel; forming a second buried barrier layer on the first buried barrier layer on the second pixel and the third pixel by performing an ion implantation process using the first mask; and forming a photoelectric conversion unit on the epitaxial layer.

The first buried barrier layer and the second buried barrier layer may be formed by doping a first type impurity having the same concentration, but the concentration of the impurity doped on the first buried barrier layer and the second buried barrier layer is higher than a concentration of impurity doped on the epitaxial layer.

Forming the photoelectric conversion unit may include: forming a second impurity implantation region of a second type on the epitaxial layer; and forming a first impurity implantation region of the first type on the second impurity implantation region, wherein the second impurity implantation region is formed to be separated from the second buried barrier layer.

The method may further include before the forming the photoelectric conversion unit; forming a second mask covering the epitaxial layer of the first pixel and the second pixel; and forming a third buried barrier layer on the second buried barrier layer of the third pixel using the second mask as an ion implantation mask, wherein the third buried barrier layer is formed by doping impurities having a concentration and a type identical to impurities doped on the second buried barrier layer.

Forming of the first buried barrier layer may include doping impurities of a first type with an energy higher than 1.4 MeV, forming the second buried barrier layer may include doping impurities of the first type with energies ranging from 1.0 MeV to 1.4 MeV, and forming the third buried barrier layer may include doping impurities of the first type with energies ranging from 0.6 MeV to 1.0 MeV.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

The present invention will now be described more fully hereinafter with reference to the accompanying drawings, in which exemplary embodiments of the invention are shown. It should be noted that, throughout the description, unless noted otherwise, when a layer is described as being formed on another layer or on a substrate, the layer may be formed directly on the other layer or on the substrate, or one or more layers may be interposed between the layer and the other layer or the substrate.

A photodiode represents a photoelectric conversion unit forming electric charge by incident light in the present embodiment.

Figure 1:
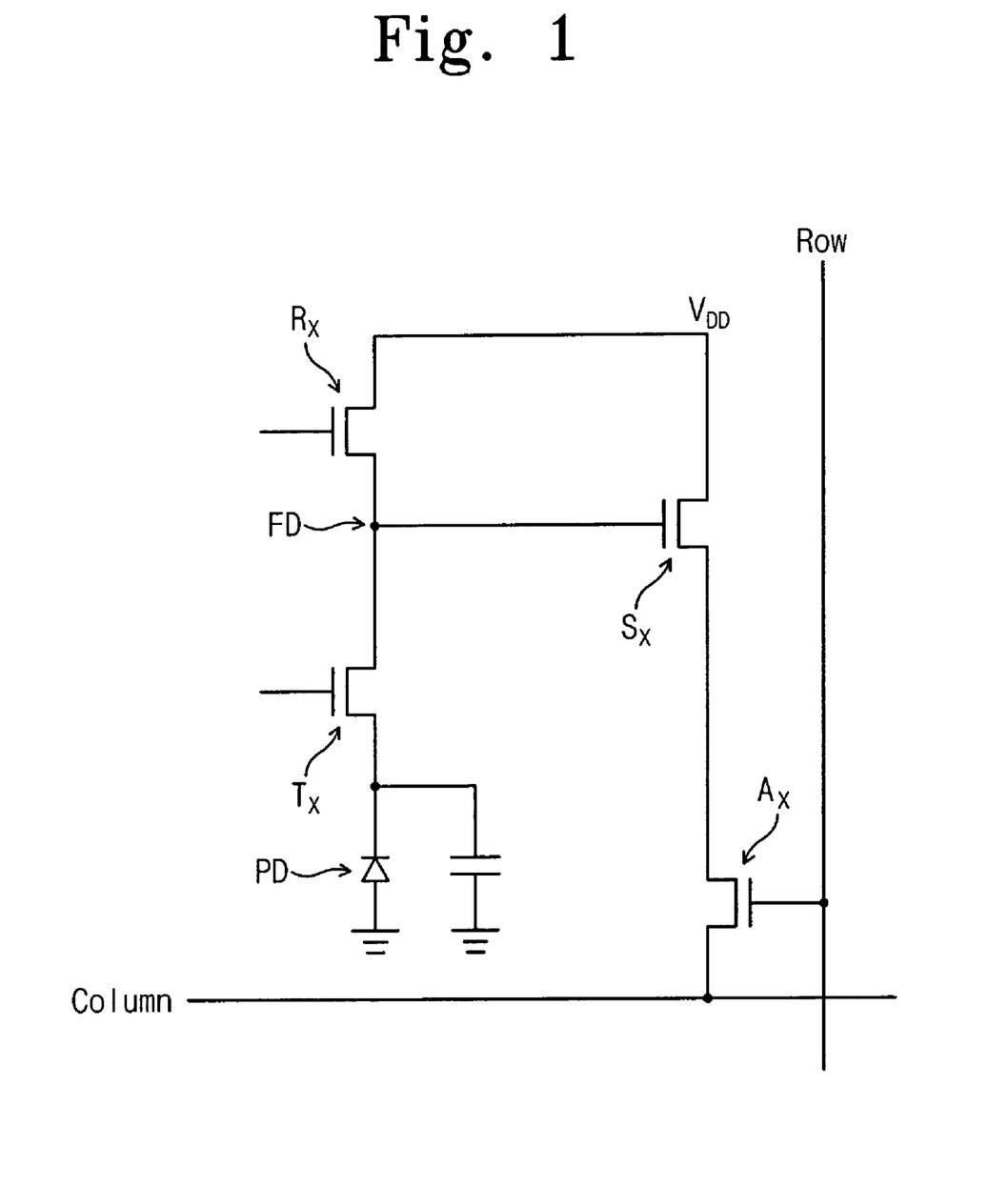
FIG. 1 is a schematic circuit diagram illustrating a CMOS image sensor according to an embodiment of the present invention.
Figure 2:
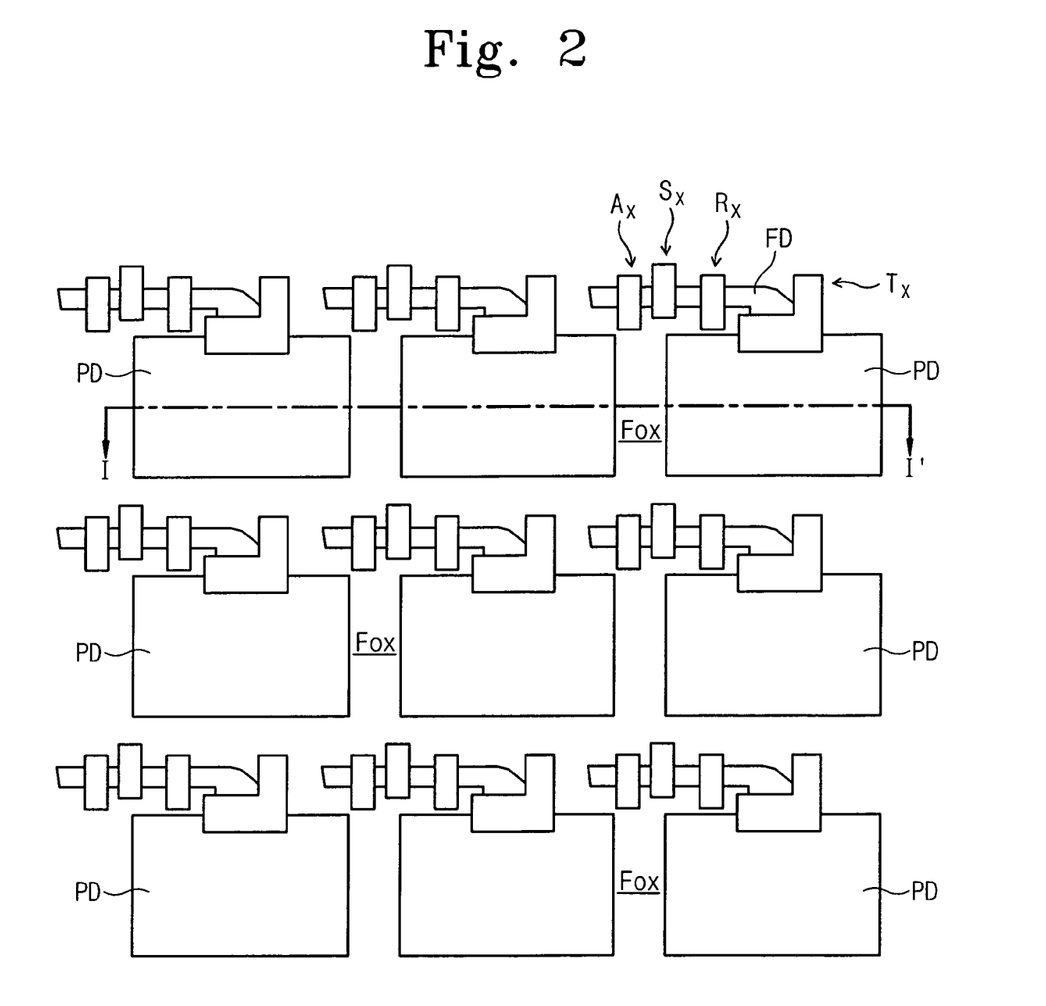
FIG. 2 is a schematic plan view of pixels of a CMOS image sensor according an embodiment of the present invention.

FIG. 1 is a schematic circuit diagram illustrating a CMOS image sensor, and FIG. 2 is a plan view of pixels of a CMOS image sensor according to an embodiment of the present invention.

Referring to FIGS. 1 and 2, the CMOS image sensor includes a plurality of unit pixels dielectrically isolated by an isolation layer $F_{ox}$. Each of the unit pixels includes a photodiode PD and four transistors Tx, Rx, Sx, Ax. A transfer transistor Tx is coupled at a longitudinal side of the photodiode PD. A reset transistor Rx, a select transistor Sx, and an access transistor Ax are sequentially arranged at one side of the transfer gate. A drain of the transfer transistor Tx, which is also a source of the reset transistor Rx, is called a floating diffusion area FD.

Operation of the CMOS image sensor will be described with reference to FIGS. 1 and 2. At first, a VDD is applied to the reset transistor Rx and the selection transistor Sx when light is intercepted, and a reference value is calculated by turning on all of four transistors or turning on three transistors excepting the transfer transistor. After turning on, the reset transistor Rx is turned off, and a light is irradiated to the photodiode PD which is a light receiving unit. As a result, the photodiode generates an electron-hole pair. If the transfer transistor Tx is turned on, the generated electric charge is transferred to the floating diffusion region FD. A gate bias of the selection transistor Sx is changed in proportion to an amount of the transferred electric charge. A variation range of electric potential of a source of the selection transistor Sx is eventually exceeded. If the access transistor Ax is turned on, a signal is read by the electric charge in a column side.

Figure 3:
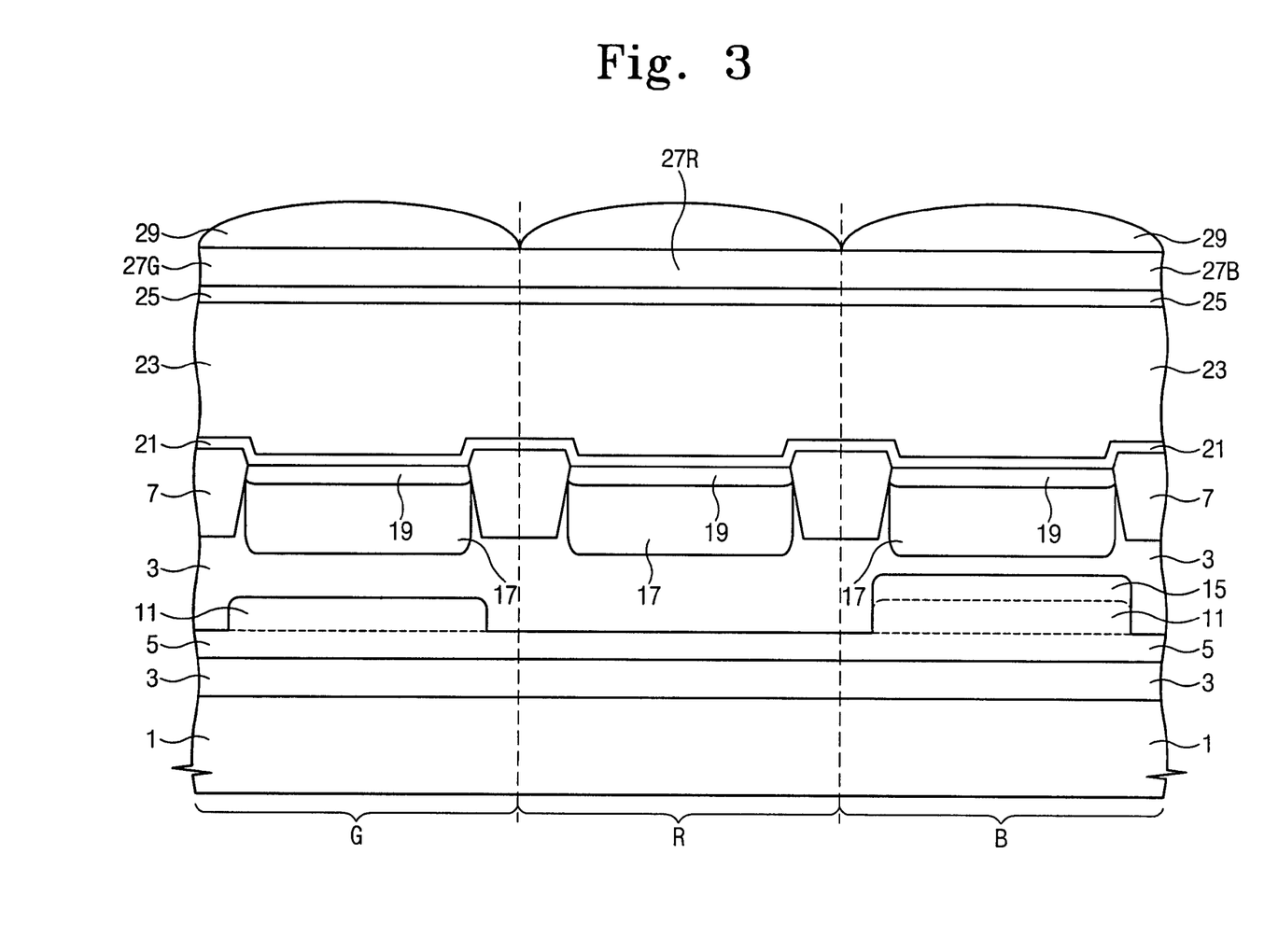
FIG. 3 is a cross sectional view of an image sensor according to an embodiment of the present invention which is obtained by cutting the image sensor shown in FIG. 2 along a line I-I'.

FIG. 3 is a cross sectional view obtained by cutting the image sensor shown in FIG. 2 along a line I-I'. That is, FIG. 3 shows a cross sectional view of an image sensor according to an embodiment of the present invention.

Referring to FIG. 3, a P-type epitaxial layer 3 is arranged on a P-type semiconductor substrate 1 having a green region (G) which is a pixel for embodying (being associated with) a green light, a red region (R) which is a pixel for embodying (being associated with) a red light, and a blue region (B) which is a pixel for embodying (being associated with) a blue light. Each of the regions G, R, B is isolated by the isolation layer 7. In the present embodiment, locations of the green region, the red region and the blue region are appropriately arranged for conveniently describing the present invention. Accordingly, the locations of the regions G, R, B may be varied. For example, the red region (R) is arranged in a center of a 3×3 arrangement formation, and the green region (G) may be arranged at a right side, a left side, an upper side or a bottom side of the red region (R). The blue region (B) may be arranged at a diagonal direction relative to the red region (R).

A first P-type impurity implantation region 19 and a second N-type impurity implantation region 17 are formed on the epitaxial layer 3 for forming a photodiode which is a light receiving unit. Also, the second N-type impurity implantation region 17 and the P type epitaxial layer may form a photoelectric conversion unit. A first buried barrier layer 5 is arranged below the second impurity implantation region 17 in the epitaxial layer 3. The first buried barrier layer 5 may be formed by doping a P-type impurity. A concentration of the impurity doped on the buried barrier layer 5 is higher than a concentration of impurity doped at the epitaxial layer 3. A second buried barrier layer 11 is formed on the first buried barrier layer 5 in the greed region G and the blue region B. A third buried barrier layer 15 is arranged on the first buried barrier layer 5 in the blue region B. The second buried barrier layer 11 and the third buried barrier layer 15 may be formed by doping P-type impurities. The concentration of the impurity doped on the second and the third buried barrier layer 11 and 15 is identical to the concentration of impurity doped on the first buried barrier layer 5. The second impurity implantation region 17 is separated from the buried barrier layer in each of regions. That is, the first buried barrier layer 5 is separated from the second impurity implantation region 17 in the red region (R). The third buried barrier layer 15 is separated from the second impurity implantation region 17 in the blue region (B).

In the present embodiment, a depletion region of a photodiode is controlled according to a wavelength of a light incident to each of regions in order to improve a sensitivity of the image sensor. As described above, a wavelength of blue light is shortest and a wavelength of red light is longest. Since the blue light reaches to an upper portion of the second impurity implantation region 17 in the blue region B, the sensitivity is not degraded although a width (depth) of the depletion region is not wider or deeper. Meanwhile, since the red light reaches to a bottom portion of the second impurity implantation region 17 in the red region (R), a depletion region having a wider width (or deeper depth) is required.

At the same time, crosstalk is prevented according to the present embodiment. That is, the buried barrier layers 5, 11, 15 block movements of electrons when an electron hole pair is generated by the red light passed through the second impurity implantation region 17 in the red region (R) to reach the epitaxial layer. That is, electrons moved in the buried barrier layers 5, 11, 15 are rejoined to holes and thus the crosstalk of adjacent pixels is prevented.

A high concentration P-type first impurity implantation region 19 may be formed on the second impurity implantation region 17 in each of regions. The first impurity implantation region 19 prevents movement of electrons generated on an unstable surface of the second impurity implantation region 17. That is, the electrons are rejoined with the holes to prevent, to suppress or to improve a dark current.

A reflection prevention layer 21, an interlayer insulation layer 23, and a planarization layer 25 may be sequentially formed on the epitaxial layer 3. For example, the reflection prevention layer 21 is formed of a nitride silicon oxide layer (SiON) or a silicon nitride layer ($Si_3N_4$). The interlayer insulation layer 23 is formed of a silicon oxide layer ($SiO_2$) or a fluorinated silicon oxide (SiOF). The planarization layer 25 may be formed of a nitride silicon oxide layer (SiON) or a silicon nitride layer ($Si_3N_4$). Color filters 27G, 27R, 27B are formed on the planarization layer 25 for embodying colors. That is, the green color filter 27G is arranged on the green region (G), the red color filter 27R is arranged on the red region (R), and the blue color filter 27B is arranged on the blue region (B). Each of the color filters 27G, 27R, 27B may be formed of colorants of corresponding colors. A micro lens is arranged on the color filters 27G, 27R, 27B to concentrate an incident light.

FIGS. 4 to 8 are diagrams illustrating a method of manufacturing a CMOS image sensor shown in FIG. 3 according to an embodiment of the present invention.

Figure 4:
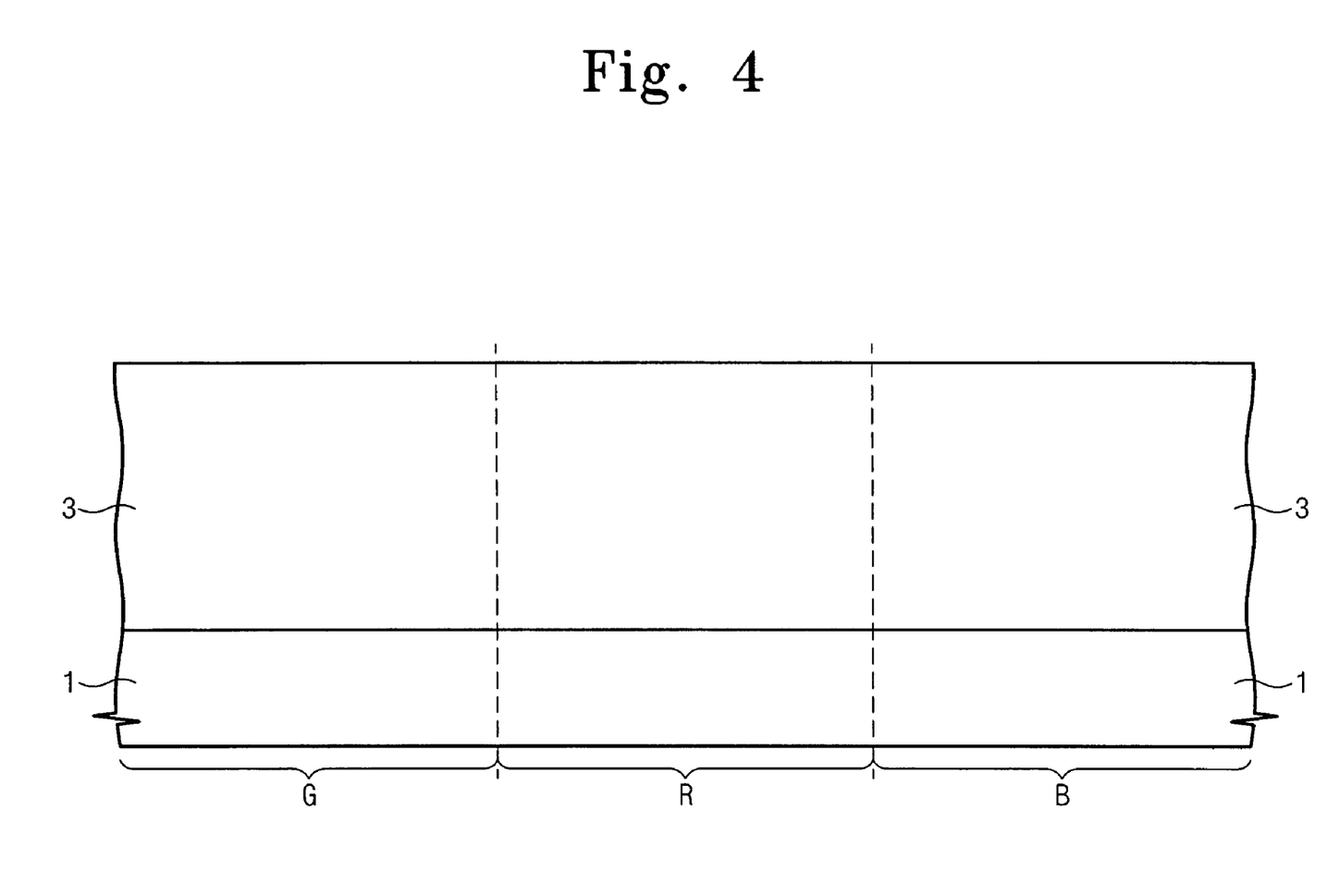
FIGS. 4 to 8 are cross sectional views illustrating a method of manufacturing a CMOS image sensor according to an embodiment of the present invention.

Referring to FIG. 4, a P-type epitaxial layer 3 is formed on a P-type semiconductor substrate 1 having a green region (G) which is a pixel for embodying a green light, a red region (R) which is a pixel for embodying a red light and a blue region (B) which is a pixel for embodying a blue light. Boron (B) may be doped while forming the epitaxial layer 3. A dose of the boron may be $1\times10^{10}$ atoms/cm$^2$.

Figure 5:
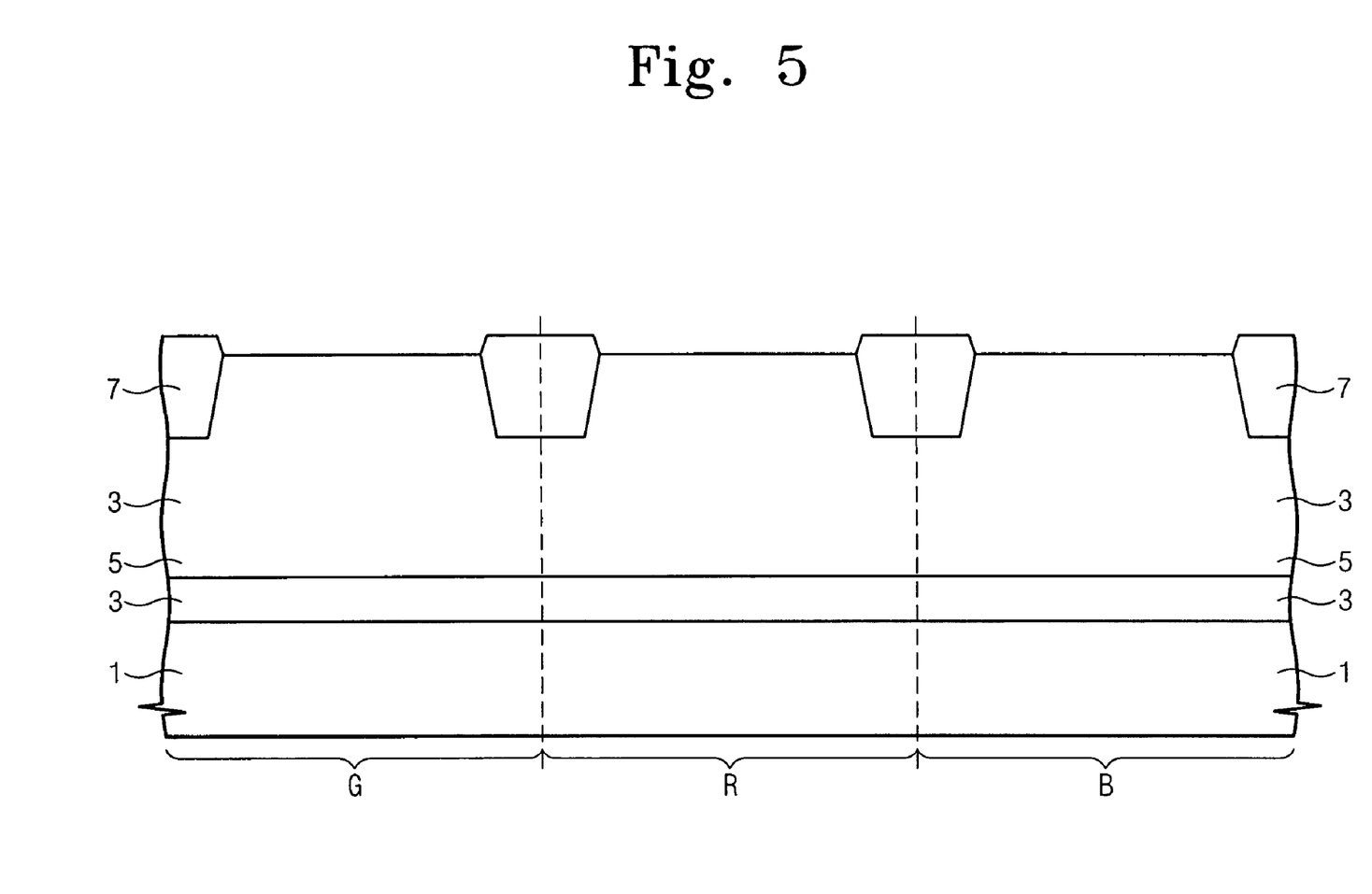

Referring to FIG. 5, a P-type first buried barrier layer 5 is formed in the epitaxial layer 3 by performing an ion implantation process. For example, the first buried barrier layer 5 may be formed by doping $1\times10^{10}$ atoms/cm$^2$ of boron with energy higher than 1.4 MeV. An isolation layer 7 is formed on the epitaxial layer 3 by using a shallow trench isolation (STI) method.

Figure 6:
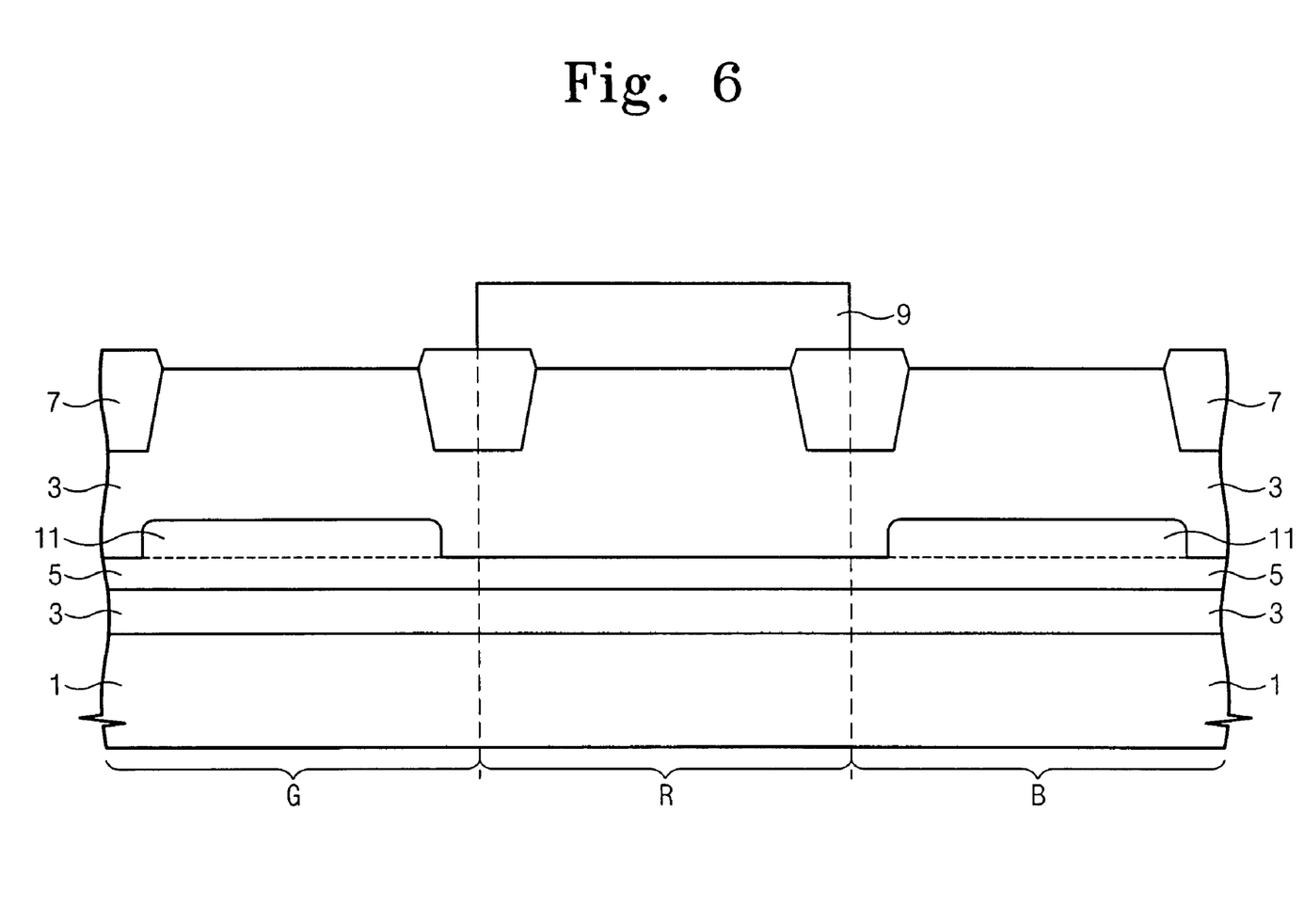

Referring to FIG. 6, a first mask 9 is formed to cover the red region (R). For example, the first mask 9 is a photo resistant pattern. A second buried barrier layer 11 is formed on the first buried barrier layer 5 in the green region (G) and the blue region (B) using the first mask 9 and the isolation layer 7 as an ion implantation mask. For example, the second buried barrier layer 11 may be formed by doping boron with energies ranging from 1.0 MeV to 1.4 MeV, where the dose of the boron is $1\times10^{12}$ atoms/cm$^2$. The second buried barrier layer 11 may be coupled to the first buried barrier layer by a succeeding thermal process.

Figure 7:
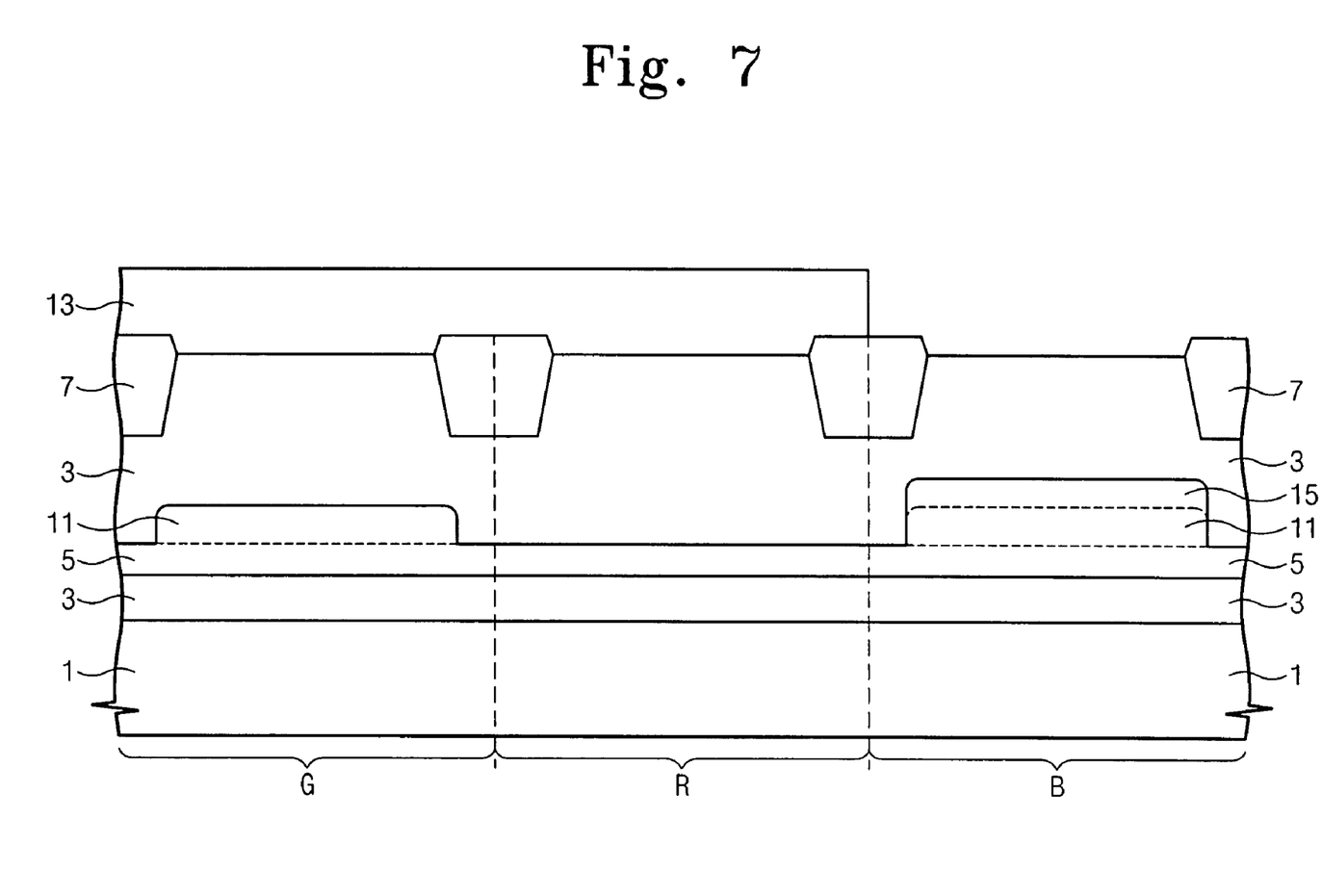

Referring to FIG. 7, a second mask 13 is formed to cover the green region (G) and the red region (R) after eliminating the first mask 9. A third buried barrier layer 15 is formed on the blue region (B) using the second mask 13 and the isolation layer 7 as an ion implantation mask. The third buried barrier layer 15 is formed by doping boron with energies ranging from 0.6 MeV to 1.0 MeV, where the dose of the boron is $1\times10^{10}$ atoms/cm$^2$. The third buried barrier layer 15 may be coupled to the second buried barrier layer 11 by succeeding thermal process.

Figure 8:
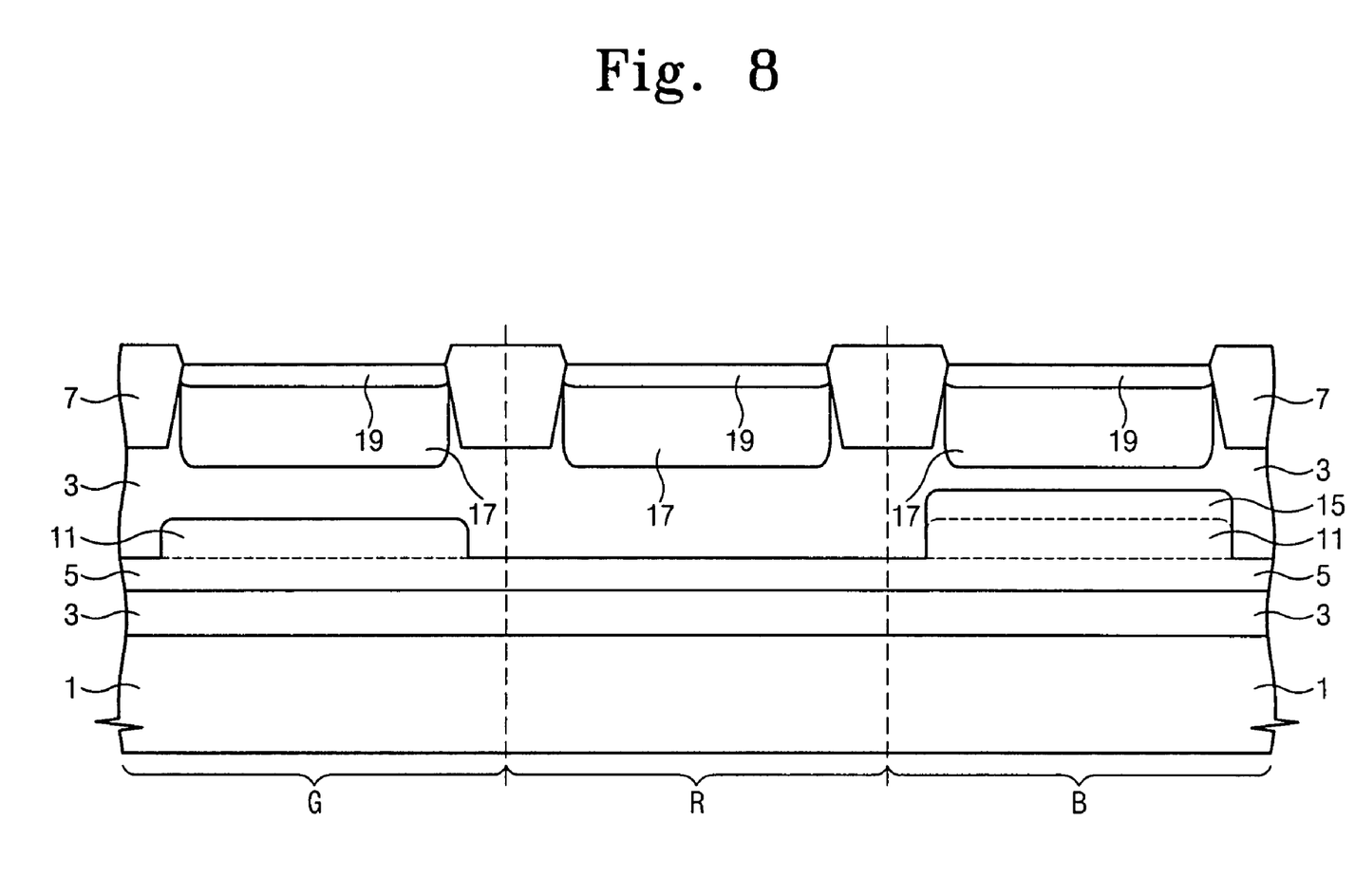

Referring to FIGS. 8 and 2, the second mask 13 is eliminated. A gate oxide layer (not shown) is formed by performing a thermal process, and gate electrodes are formed to form transistors shown in FIG. 2. An ion implantation process is performed using the isolation layer 7 and the gate electrode as an ion implantation mask. And, a P-type first impurity implantation region 19 may be formed on the second impurity implantation region 17 by performing an ion implantation process. The ion implantation processes are performed to form source/drain regions of the transistors.

Referring to FIG. 3, the reflection prevention layer 21, the interlayer insulation layer 23 and the planarization layer 25, color filters 27G, 27R, 27B and a micro lens 29 are sequentially formed to completely form the image sensor shown in FIG. 3.

After performing each of the ion implantation processes, a plurality of thermal processes (not shown) may be performed. Alternatively, single terminal process may be performed after completely performing the ion implantation processes.

As described above, the buried barrier layers are formed below the photodiode in the image sensor according to the present invention. The thicknesses of the buried barrier layers are differently formed according to wavelengths of the incident lights. Accordingly, the buried barrier layers prevent the electric charge, which is generated by an incident light having longer wavelengths such as a red light, from moving to a photodiode region of the adjacent pixel. Therefore, crosstalk is prevented. Furthermore, sensitivity of the image sensor may be improved by differently forming a thickness of a depletion layer according to a wavelength of the incident light.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A CMOS image sensor comprising a plurality of pixels associated with colors of different wavelengths, wherein each of the pixels comprises:
   a photoelectric conversion unit; and
   a buried barrier layer arranged below the photoelectric conversion unit,
   wherein a thickness of the buried barrier layer is different according to the different wavelengths, and wherein a thickness of the buried barrier layer is thinner as the wavelength is longer.

2. The CMOS image sensor of claim 1, wherein the photoelectric conversion unit comprises:
   a first impurity implantation region of a first type; and
   a second impurity implantation region of a second type arranged under the first impurity implantation region,
   wherein the buried barrier layer is doped with impurities of the first type.

3. The CMOS image sensor of claim 2, wherein the buried barrier layer is separated from the second impurity implantation region.

4. A CMOS image sensor comprising a plurality of pixels associated with colors of different wavelengths, wherein each of the pixels comprises:
   a photoelectric conversion unit; and
   a buried barrier layer arranged below the photoelectric conversion unit,
   wherein a thickness of the buried barrier layer is different according to the different wavelengths, and
   wherein the photoelectric conversion unit comprises:
      a first impurity implantation region of a first type; and
      a second impurity implantation region of a second type arranged under the first impurity implantation region,
      wherein the buried barrier layer is doped with impurities of the first type and wherein the buried barrier layer is separated from the second impurity implantation region.

5. A CMOS image sensor having a first pixel associated with a red color, a second pixel associated with a green color and a third pixel associated with a blue color, wherein each of pixels comprises:
   a semiconductor substrate of a first type;
   an epitaxial layer of a first type on the semiconductor substrate;
   a photoelectric conversion unit arranged on the epitaxial layer; and
   a first buried barrier layer below the photoelectric conversion unit in the epitaxial layer,
   wherein the second pixel and the third pixel further comprise a second buried barrier layer on the first buried barrier layer.

6. The CMOS image sensor of claim 5, wherein each of the pixels further comprises:
   an isolation layer arranged at the epitaxial layer for isolating each of pixels;
   an interlayer insulation layer covering the epitaxial layer and the isolation layer;
   a planarization layer on the interlayer insulation layer;
   a color filter arranged on the planarization layer for embodying each of colors corresponding to each of the pixels; and
   a micro lens on the color filter.

7. The CMOS image sensor of claim 5, wherein the photoelectric conversion unit comprises a first impurity implantation region of a first type and a second impurity implantation region of a second type under the first impurity implantation region,
   wherein the first buried barrier layer and the second buried barrier layer are doped with impurities of the first type.

8. The CMOS image sensor of claim 7, wherein the second buried barrier layer is separated from the second impurity implantation region.

9. The CMOS image sensor of claim 7, wherein a concentration of an impurity doped on the first buried barrier layer is identical to a concentration of an impurity doped on the second buried barrier layer, but higher than a concentration of an impurity doped on the epitaxial layer.

10. The CMOS image sensor of claim 9, wherein the third pixel further comprises a third buried barrier layer formed on the second buried barrier layer, wherein the third buried barrier layer is doped with an impurity having the same concentration and type as an impurity doped on the first buried barrier layer.

11. The CMOS image sensor of claim 10, wherein the third buried barrier layer is separated from the second impurity implantation region.

* * * * *